United States Patent [19]

Gray et al.

[11] 4,129,863
[45] Dec. 12, 1978

[54] WEIGHTED CAPACITOR ANALOG/DIGITAL CONVERTING APPARATUS AND METHOD

[75] Inventors: Paul R. Gray, Orinda, Calif.; James L. McCreary, Red Bank, N.J.; David A. Hodges, Berkeley, Calif.

[73] Assignee: Regents of the University of California, Berkeley, Calif.

[21] Appl. No.: 838,908

[22] Filed: Oct. 3, 1977

[51] Int. Cl.$^2$ .................................... H03K 13/02
[52] U.S. Cl. ............................................. 340/347 AD
[58] Field of Search ................ 340/347 AD, 347 DA, 340/347 M, 347 C

[56] References Cited

U.S. PATENT DOCUMENTS

| | | | |
|---|---|---|---|
| 3,056,085 | 9/1962 | James | 340/347 AD |
| 3,251,052 | 5/1966 | Hoffman | 340/347 AD |
| 3,653,030 | 3/1972 | Carbrey | 340/347 AD |
| 3,906,488 | 9/1975 | Suarez | 340/347 AD |

Primary Examiner—Charles D. Miller
Attorney, Agent, or Firm—Townsend & Townsend

[57] ABSTRACT

An array of binary weighed capacitors, an additional capacitor having a capacitance value equivalent to that of the least of the binary weighted capacitors, a voltage comparator, switches for interconnecting the capacitors with certain predetermined voltage levels and the comparator, and a sequencing circuit are included. One side of all of the capacitors is connected to one input terminal on the comparator and the other side has applied thereto the signal to be quantized. Switch sequencing combines divided portions of a reference voltage with the signal to be quantized for presentation to the input of the comparator which thereby provides a serial digit output connected to the sequencing circuit. In this fashion, a linear conversion between an analog and a digital signal is made by the sequencing circuit. A nonlinear converter between digital and analog signal presentation is also disclosed.

16 Claims, 15 Drawing Figures

| PERIOD | | $t_1-t_0$ | $t_2-t_1$ | $t_3-t_2$ | $t_4-t_3$ | $t_5-t_4$ | $t_6-t_5$ | $t_7-t_6$ | $t_8-t_7$ | $t_9-t_8$ | $t_{10}-t_9$ |
|---|---|---|---|---|---|---|---|---|---|---|---|
| | S1 | C | C | O | O | O | O | O | O | O | O |
| | S2 | 1 | 2 | 2 | 1 | 2 | 1 | 1 | 1 | 1 | 1 |
| SWITCH POSITIONS C-CLOSED O-OPEN | S3 | 1 | 2 | 2 | 1 | 1 | 1 | 2 | 2 | 2 | 2 |
| | S4 | 1 | 2 | 2 | 1 | 1 | 1 | 1 | 2 | 2 | 2 |
| | S5 | 1 | 2 | 2 | 1 | 1 | 1 | 1 | 1 | 2 | 2 |
| | S6 | 1 | 2 | 2 | 1 | 1 | 1 | 1 | 1 | 1 | 1 |
| | S7 | | 1 | 1 | 2 | 2 | 2 | 2 | 2 | 2 | 2 |

WEIGHTED CAPACITOR ANALOG/DIGITAL CONVERTING APPARATUS AND METHOD

GOVERNMENT GRANT

The invention described herein was made in the performance of work under research grant NSF-76-7-GK-40912 from the National Science Foundation.

This is a continuation of application Ser. No. 656,875 filed Feb. 10, 1976 now abandoned.

BACKGROUND OF THE INVENTION

This invention relates to weighted capacitor analog/digital conversion circuitry and techniques and more particularly to such conversion techniques utilizing metal oxide semiconductor circuitry providing conversion with either a linear relationship between the analog and digital signals or a nonlinear relationship therebetween.

Conventional techniques for performing analog/digital conversion generally require sophisticated analog circuitry including operational amplifiers, and digital circuitry for counting, sequencing, and data storage. Consequently, hybrid circuits have resulted including one or more bipolar analog circuit elements together with metal oxide semiconductor circuit elements for performance of the digital functions while remaining within reasonable economic limits. Applications exist for coding analog signals in nonlinear digital codes and for subsequent decoding to an analog form. Voice signals for telephone transmission and subsequent reception are often subjected to such nonlinear coding and decoding. Present coder/decoder installations are complex and expensive, therefore requiring multiplexing for sharing of the installations so that they may accommodate multiple telephone transmissions simultaneously. A low cost configuration of minimal complexity if desirable for use in both linear and nonlinear conversion between analog and digital signal forms, while maintaining low error and distortion levels through the conversions.

SUMMARY AND OBJECTS OF THE INVENTION

In general, the electronic circuitry disclosed herein for converting between analog and digital signal forms includes an array of weighted capacitors having capacitance values corresponding to individual digits within a predetermined range of digits from a most to a least significant digit in the range. An additional capacitor having a capacitance value equivalent to the value of the capacitor in the array corresponding to the least significant digit is connected to the array. All of the capacitors in the array and the additional capacitor have one terminal connected to a common point and to one input of a voltage comparator. Another input on the voltage comparator is connected to a comparator reference voltage and the other terminals on the array of capacitors are connected to individual ones in a plurality of switches. Each of the plurality of switches is capable of selecting one of several terminals to which are connected the comparator reference level, an analog signal level, and an analog signal reference level. The plurality of switches are operated in predetermined sequence by a digital control circuit coupled to receive a serial digit output from the voltage comparator. Thus, an analog signal connected to one of the several terminals produces a digital combination from the digital control circuit and a digital combination connected to the digital control circuit produces an analog signal at another of the several terminals.

It is an object of the present invention to provide conversion between analog and digital signals in minimal time with a high degree of accuracy using simple easily fabricated circuitry.

Another object of the invention is to provide conversion between analog and digital signal forms wherein parasitic capacitance is removed as an error factor.

Another object of the present invention is to provide conversion between analog and digital signal forms utilizing circuitry having inherent sample and hold functions.

Another object of the present invention is to provide conversion between analog and digital signal forms wherein component offset voltages are compensated prior to the conversion.

Another object of the present invention is to provide conversion between analog and digital signal forms wherein there is a nonlinear relation between the analog and digital signals.

Another object of the present invention is to provide conversion between analog and digital signal forms in a device which may be used as a coder or a decoder.

Another object of the present invention is to provide conversion between analog and digital signal forms which is inexpensive enough to allow elimination of multiplexing and institution of per channel coding and decoding.

Additional objects and features of the invention will appear from the following description in which the preferred embodiment has been set forth in detail in conjunction with the accompanying drawings.

DESCRIPTION OF THE PREFERRED EMBODIMENTS

Figure 1:
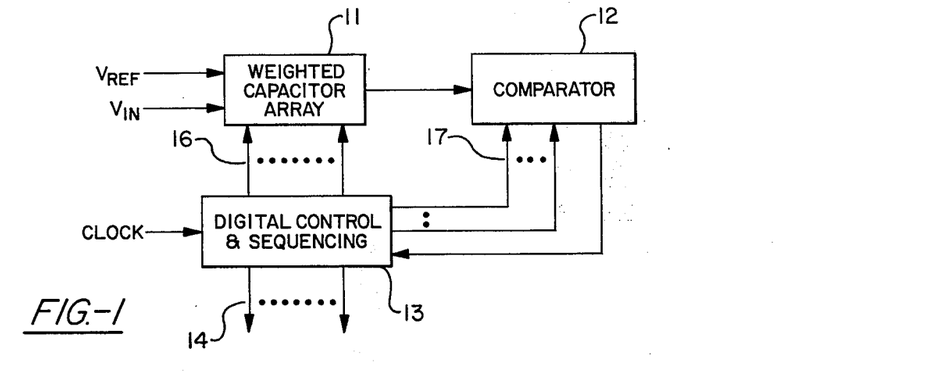
FIG. 1 is a block diagram of the weighted capacitor analog/digital converter.

Referring to FIG. 1 of the drawings, a block diagram of one embodiment of the device for converting between analog and digital signal forms is shown. A weighted capacitor array 11 is shown receiving an analog reference signal $V_{REF}$ and an analog signal $V_{IN}$. Weighted capacitor array 11 produces a successive approximation signal $V_X$ which is connected to a comparator 12. Comparator 12 produces a serial digital output which is coupled to a digital control and sequencing circuit 13. A plurality of digital data output terminals 14 is available at digital control sequencing circuit 13. Digital control sequencing circuit 13 receives a clock input for providing sequence dwell time and produces a series of switching functions on a plurality of switching function terminals 16 coupled to weighted capacitor array 11 and 17 coupled to comparator 12.

Figure 2:
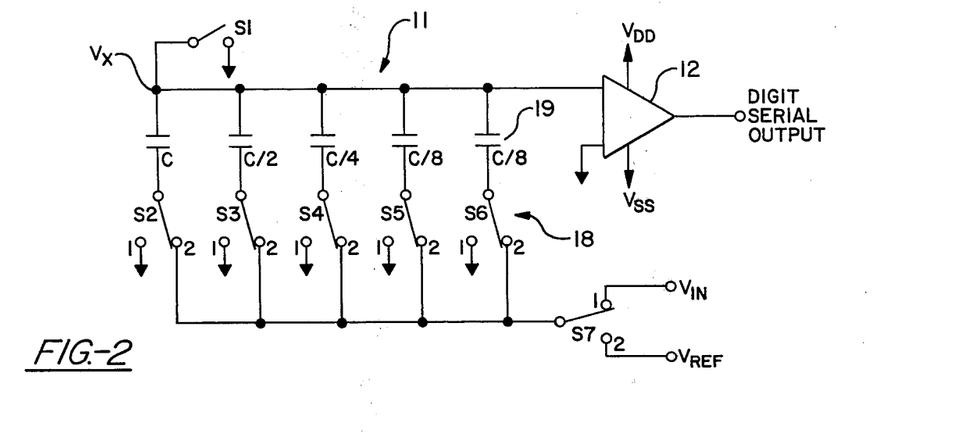
FIG. 2 is a schematic diagram of the weighted capacitor array and a plurality of switches included in the digital control and sequencing circuit.

FIG. 2 shows the weighted capacitor array 11 in circuit with a plurality of switches 18 included in digital control and sequencing circuit 13 for controlling charge placed on individual ones of the capacitors in the capacitor array 11 and for connecting thereto predetermined ones of the analog signal $V_{IN}$, analog reference signal $V_{REF}$ and the reference signal for comparator 12, which is shown in FIG. 2 as ground. One terminal of all of the capacitors in the array is connected to a common point and in turn connected to one input of comparator 12. The voltage at the common point or the input to comparator 12 is designated as $V_X$. A switch S1 is provided for selectively placing the common point for the capacitors in the array at ground potential. Another switch S7 is provided for selecting the analog signal $V_{IN}$ or the analog reference signal $V_{REF}$. It should be noted that digital control and sequencing circuit 13 includes sequencing and control logic which controls all of the switches in the circuit on the time base provided by the clock input to the digital control and sequencing circuit 13. The capacitors in the weighted capacitor array 11 have values as indicated in the example of FIG. 2 corresponding to a predetermined number of binary bits ranging from a most to a least significant bit. The capacitor representing the most significant bit is marked C and that representing the least significant bit is marked C/8. An additional capacitor 19 is provided having a capacitance value equivalent to that of the capacitor representing the least significant bit, which is in this example C/8. It is seen in FIG. 2 that one terminal on additional capacitor 19 is also connected to the common point at one input to comparator 12.

The plurality of switches 18 are designated S2 through S6 in this example, each having terminals marked 1 and 2. Switches S2 through S6 selectively place the other terminal on individual capacitors in the capacitor array 11 to ground potential in position 1 or to switch S7 in position 2. Switch S7 in turn has two positions 1 and 2 for selecting the analog signal $V_{IN}$ or the analog reference signal $V_{REF}$ respectively. As indicated in FIG. 2, a digit serial output is provided by comparator 12 in accordance with the successive approximation signal level $V_X$. The digit serial output is connected to digit control and sequencing circuit 13 as mentioned above for controlling the sequence and control logic and the switching sequence of switches S1 through S7.

Figure 3:
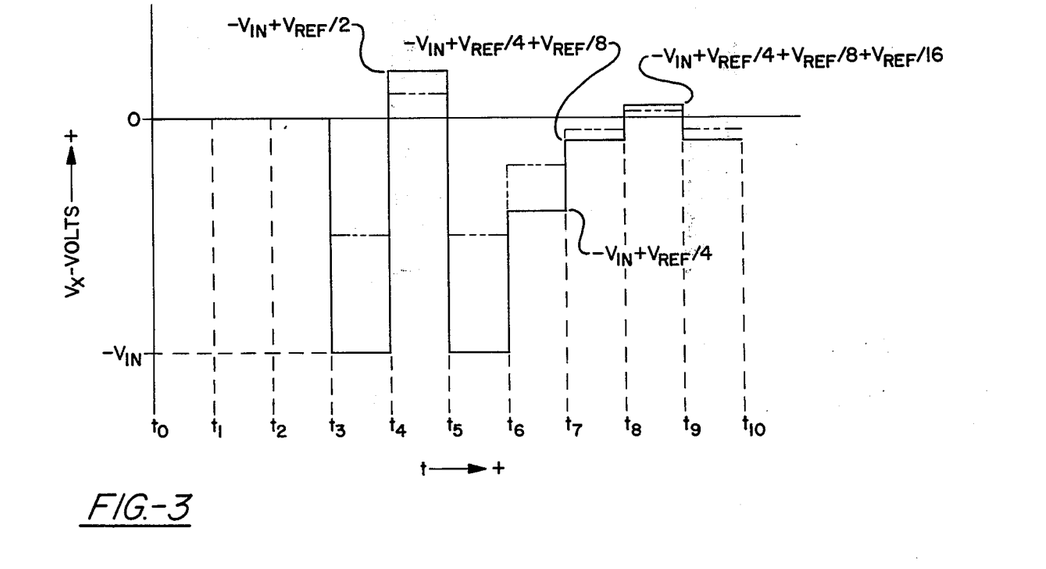
FIG. 3 is a timing diagram showing a typical example of successive approximation accomplished by the embodiments of FIGS. 1 and 2.
Figure 4:
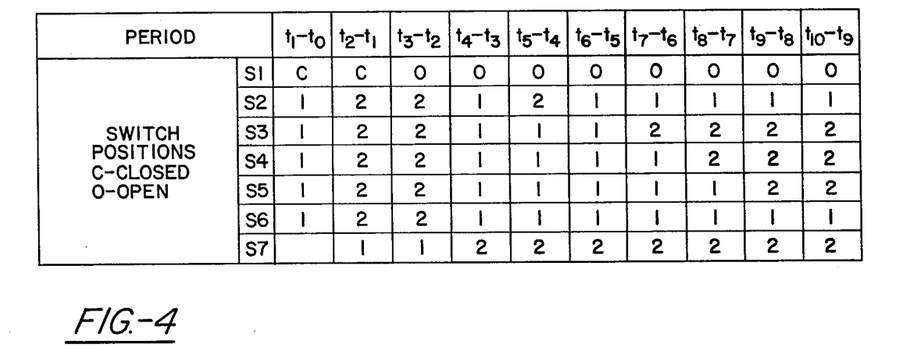
FIG. 4 is a chart showing the positions of the switches of FIG. 2 in sequence for obtaining the timing diagram of FIG. 3.

Turning to FIG. 3 the manner in which the device of FIGS. 1 and 2 operates will be described. The successive approximation signal level $V_X$ is shown on the ordinate of the chart of FIG. 3 and the abscissa is divided into time periods as indicated and as provided by the clock input to digital control and sequencing circuit 13. In this example to be presented a conversion from an analog signal $V_{IN}$ to a digital signal will be followed. The sequence begins at time $t_0$ and during the first period $t_1-t_0$, switch S1 is closed to ground and switches S2 through S6 are also placed in position 1 to ground. In this fashion, all of the capacitors in the array and additional capacitor 19 are discharged. It will be noted that the total of all of the capacitance values in the array 11 and additional capacitor 19 is 2C. Consequently when switch S7 is placed in position 1 to select $V_{IN}$ and switches S2 through S6 are placed in position 2, a charge is stored in the capacitors of $2CV_{IN}$ at the common point or plates of the capacitors. Thus, the analog signal $V_{IN}$ is sampled during the second period $t_2-t_1$. During the third period $t_3-t_2$, switch S1 is opened, removing the common capacitor plates from ground. During the fourth period, $t_4-t_3$, switches S2 through S6 are connected to ground, and since the charge on the common plate is conserved, $V_X$ assumes a potential of $-V_{IN}$ in the absence of parasitic capacitance to ground. Switch S7 is placed in position 2 during the fourth period, preparatory to applying portions of the analog reference voltage $V_{REF}$ to the common plate of the capacitors for modifying the voltage $V_X$.

During the fifth period, $t_5-t_4$, switch S2 is placed in position 2 thereby connecting $V_{REF}$ to one terminal of capacitor C. It may be seen that the circuit arrangement existing in the fifth period is such as to divide $V_{REF}$ in the series capacitance voltage divider between $V_{REF}$ and ground consisting of capacitance C in series with the remainder of the capacitance, which is also equivalent to C. Therefore, $V_{REF}/2$ is applied at the common plate of the capacitors during the fifth period and $V_X$ is the combination of $-V_{IN}$ and $V_{REF}/2$. Comparator 12 provides an output signifying $V_X$ as being in excess of the ground reference to the comparator 12 and the serial digit output produced thereby and connected to digital control and sequencing circuit 13 causes switch S2 to be repositioned in position 1 during the sixth period $t_6-t_5$.

During the seventh period, $t_7-t_6$, switch S3 is placed in position 2 to select $V_{REF}$ to be applied to one terminal of the capacitance C/2. In the same fashion as explained above, a series capacitance voltage divider is in existance during the seventh period wherein $V_{REF}/4$ is added to $V_X$, so that the successive approximation signal assumes a value which is the combination of $-V_{IN}$ and $V_{REF}/4$. This produces a serial digit output from comparator 12 to digital control and sequencing circuit 13 which retains switch S3 in position 2 and, during the eighth period $t_8-t_7$, places switch S4 in position 2 to provide $\frac{3}{8}$ of $V_{REF}$ in successive approximation signal $V_X$. Thus, during the eighth period the input to comparator 12 is the combination of $-V_{IN}$ and $\frac{3}{8} V_{REF}$. The serial digit output from comparator 12 connected to digital control and sequencing circuit 13 retains S4 in position 2 as well as S3 and during the ninth period, $t_9$–$t_8$, switch S5 is placed in poistion 2. It may be seen by reference to FIG. 3 that the combination voltage produced during the ninth period is in excess of the comparator reference voltage and the serial digit output directs the digital control and sequencing circuit 13 to reposition switch S5 in position 1 during the tenth period, $t_{10}$–$t_9$. The successive approximation at the input of comparator 12 is complete and the analog voltage $V_{IN}$ is presented at the data output terminals 14 of digital control and sequencing circuit 13 as the four bit binary number 0110.

Remaining with FIG. 3 it may be shown that parasitic capacitance existing at the input of comparator 12 will not affect the accuracy of the conversion as it has in prior conversion schemes. A property of the conversion technique is that, since the successive approximation signal $V_X$ is nulled back toward the zero or comparator reference position as the bit decisions are made, the parasitic capacitance from the common plate of the capacitors to ground in this example does not affect accuracy. When the comparator input voltage $V_X$ is nulled back to the comparator threshold, which is ground in this example, the charge on the parasitic capacitor is identical to that which exists at the end of the sample mode during the third period $t_3$–$t_2$. Therefore the error charge placed on the parasitic capacitor by sampling is conserved and error contributed thereby during the ensuing redistribution periods is zero. The parasitic capacitance increases the total capacitance in the array of capacitors. This decreases the voltage division characteristics of each capacitor in the array. Thus, smaller fractions of the analog reference signal $V_{REF}$ are subtracted from the analog signal $V_{IN}$, but the analog signal $V_{IN}$ appears as a lower signal level at the common point for the capacitors, so the effect is inherently compensated. The dashed lines signifying the level of the successive approximation signal $V_X$ in FIG. 3 represent a situation which is a gross case and is presented here for illustrative purposes only. Where, as shown, the level of the analog voltage $V_{IN}$ is cut in half, the parasitic capacitance is equivalent to 2C. Thus the capacitance array actually contains 4C, but only the 2C containing charge distributed and redistributed by the digital control and sequencing circuit 13 enters into the successive approximation. While the successive approximation signal levels $V_X$ are lower in this latter case, the comparative levels have the same sense and the serial digital output from comparator 12 for sequencing the operative switches S2 through S5 for redistribution of charge is the same.

Figure 5:
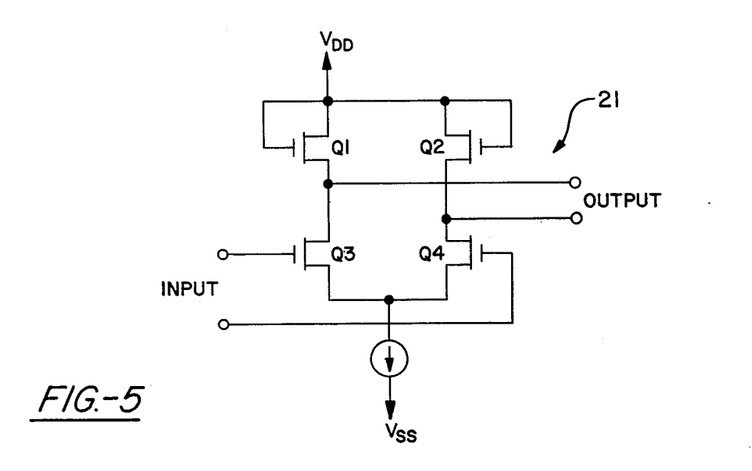
FIG. 5 is an electrical schematic diagram of one stage of a comparator used in the invention.

Another error source in the disclosed circuitry derives from what is known as comparator offset. Comparator offset is that value of comparator output which exists for zero differential comparator input. The comparator output is proportional to comparator input, but the output is amplified and the slope of the output as a function of input signal is steep. Therefore, the output from comparator 12 is such as to be either near zero or at some large value thereby providing the serial digital output indicative of an input which is either in excess or not in excess of the comparator reference. Offset is the departure from this ideal situation wherein some small output exists at the comparator when the input terminals are both placed at the same input potential. Referring to FIG. 5, a differential amplifier circuit 21 is shown wherein the offset characteristic is caused by a mismatch of field effect transistor characteristics. The mismatch which primarily produces the offset is between transistors Q3 and Q4 of FIG. 5. Metal oxide semiconductor contruction of all of the circuit elements necessary to this invention is made possible by the concept of this invention. However, metal oxide semiconductor (MOS) construction of the comparator of FIG. 5 is especially susceptible to offset voltage errors. The offset exists as a DC differential voltage at the output of the comparator when the input differential is zero. Described in an alternate manner, a signal differential occurring between the input terminals of the comparator may produce an output modified by the offset voltage of the comparator which is not a true indication of the differential between the input terminals. Consequently, an error in the serial digital output could occur and an error would accure in the conversion.

One manner of compensating for the offset voltage in the comparator 12 is to couple the offset output through a buffering element and switch to the common point for the capacitor array 11 during the sampling mode to thereby compensate for the offset voltage in the signal at the input of the comparator prior to beginning the redistribution of charge and successive approximation sequencing.

Figure 6:
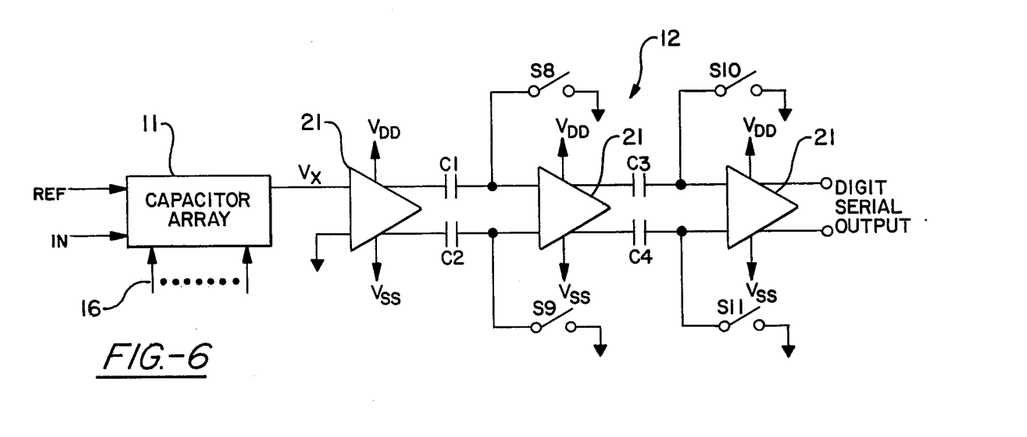
FIG. 6 is a combination block and electrical schematic diagram demonstrating one form of offset voltage compensation.

Referring to FIG. 6 of the drawing the voltage comparator 12 is shown as a multistage circuit containing, in this example, three stages of the differential amplifier circuit 21 of FIG. 5 utilizing MOS field effect transistors (FETS) Q1 through Q4 and having input and output terminals as shown. The offset voltage may be stored in the circuit of comparator 12 by means of the capacitors C1 through C4 and switches S8 through S11 shown in FIG. 6. Prior to the sampling mode while switch S1 of FIG. 2 is closed, all switches S8 through S11 are also closed. In this fashion, any offset voltage existing at the output of the first stage of comparator 12 is stored as a difference voltage between capacitors C1 and C2. When switches S8 and S9 are open together with S1 of FIG. 2, a compensation voltage is stored at the input to the second stage of comparator 12 which is equivalent to the offset of the first stage.

In FIG. 6 it should be noted that compensation is made only for the offset voltages of the first and second stages. The offsets in the multistage circuit are divided by the gains of the previous stages. Therefore assuming a gain of ten in each stage in the circuit of FIG. 6 and a 50 millivolt offset for the first stage, a 0.5 millivolt offset would be the residual offset therefrom at the input to the third stage. Thus correction for each of the three stages is unnecessary and a practical circuit is seen in FIG. 6 having no offset correction in the third stage. It should be noted that the inherent offset characteristic obtained in MOS circuitry technology is conveniently compensated through the use of MOS circuit technology to provide the circuit seen in FIG. 6. While offset errors are less severe in bipolar circuitry, such a correction technique could not be utilized in bipolar circuitry because of the discharge paths presented in the bipolar elements which would prevent storage of the offset compensation signals on capacitors in the bipolar circuitry.

The initial voltage $V_X$ established at the common plate of the capacitor array by closing switch S1 need not be ground as shown, but must only be the threshold voltage of the comparator 12. With this in mind, a method has been disclosed for converting between an analog and a digital indication which includes the steps of weighting an array of capacitors so that they assume capacitance values which are in digital relation from a most to a least significant digit. Further steps include connecting one end of each of the capacitors in the array to a common point and discharging the array of capacitors so that zero charge is stored thereon. Subsequently the step of charging the array of capacitors with an analog signal is undertaken. A reference signal for the analog signal is divided in the array of capacitors thereby imparting a reference charge to the common point by sequentially connecting ones of the array of capacitors between the reference signal and the common point while the remainder of the array of capacitors is in series connection between the common point and a discharge reference. A trial signal is thereby constructed at the common point which is thereafter coupled to a comparator having the discharge level as a reference input. In this fashion, a serial digital output is provided as the output of the comparator in accordance with serial comparisons between the discharge level and the trial signal. The step of connecting a reference charge in a predetermined sequence to the capacitors in the array operates to cause the trial signal to converge toward the discharge reference level. In this fashion, any charge imposed on parasitic capacitance in the converter appearing between the common point and the discharge reference level converges toward the initial charge on the parasitic capacitance imposed during the sampling period. The method is completed by sequencing the steps of discharging the capacitor array, sampling and charging the capacitor array, and redistributing the charge on the capacitor array so that the serial digital output from the comparator is in a predetermined digit sequence in accordance with the analog signal.

Figure 7:
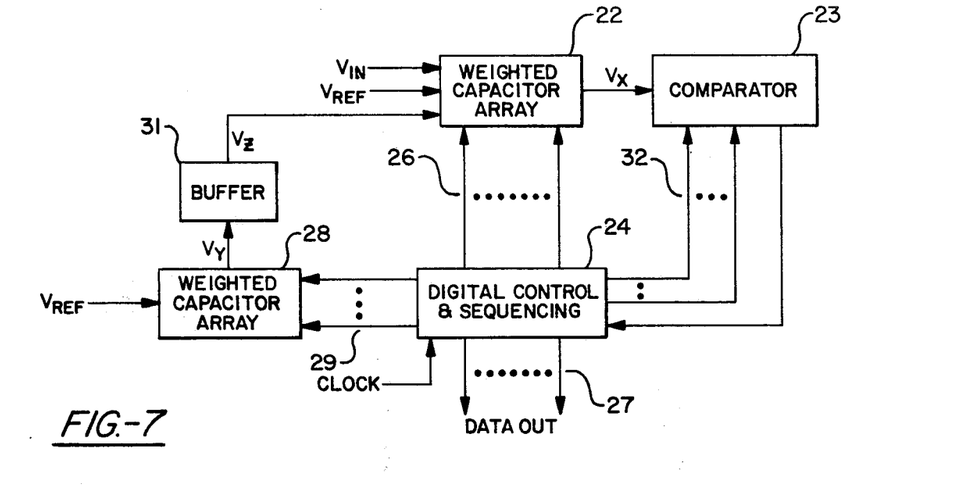
FIG. 7 is a block diagram illustrating a nonlinear analog/digital converter.
Figure 9:
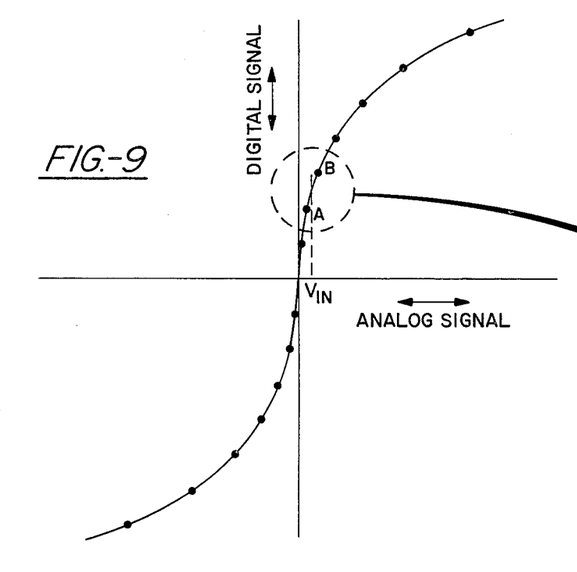
FIG. 9 is a chart showing nonlinearity between the digital and analog signals.
Figure 10:
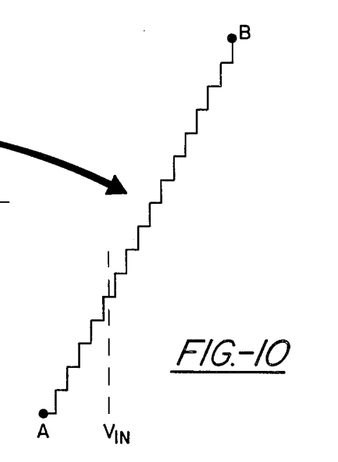
FIG. 10 is a detail view of the segment A—B of FIG. 9.

The block diagram of FIG. 7 shows the major elements in a nonlinear converter between analog and digital signals. The nonlinear converter will be disclosed in terms of a device which finds utility as a companded pulse code modulation voice coder/decoder and which uses monolithic arrays of binary weighted MOS capacitors providing a standard 15 segment approximation to the 255μ compression law in a coder for pulse code modulation PCM telephony. The level of expense and complexity of the nonlinear converter disclosed herein suggests that a per channel voice coder/decoder is realizable in a single MOS chip. The arrangement of FIG. 7 will allow coding of voice signals in nonlinear digital codes for digital telephone transmission while maintaining an exceptably high ratio of signal to noise and low distortion over a wide dynamic range without requiring an excessive digital transmission bandwidth. Widely used in the United States is the fifteen segment approximation of the $\mu =$ 255 compression law, which is illustrated in FIG. 9 and 10 to be discussed hereinafter. Returning to FIG. 7, a weighted capacitor array 22 similar to array 11 above is attached to terminals for connection to an analog voltage $V_{IN}$ and an analog voltage reference $V_{REF}$. Weighted capacitor array 22 provides a successive approximation voltage $V_X$ which is connected to a comparator 23, which provides a serial digital output connected to a digital control and sequencing circuit 24. A plurality of sequencing outputs 26 are directed to weighted capacitor array 22. A plurality of digital data output terminals 27 are provided on digital control and sequencing circuit 24. An additional weighted capacitor array 28 is provided which receives the analog signal reference voltage $V_{REF}$ as well as a plurality of sequencing outputs 29 from digital control and sequencing circuit 24. Additional weighted capacitor array 28 provides an output signal $V_Y$ connected to a buffer element 31. Buffer element 31 provides an output signal $V_Z$ for coupling to weighted capacitor array 22. A plurality of sequencing outputs 32 are connected from digital control and sequencing circuit 24 to comparator 23. The time base for the sequencing outputs 26, 29 and 32 are provided by a clock input to digital control and sequence circuit 24.

The foregoing description is for illustrative purposes, and it should be understood that the additional weighted capacitor array 28 and buffer amplifier 31 may be replaced by any type of digital-to-analog conversion device.

Figure 8:
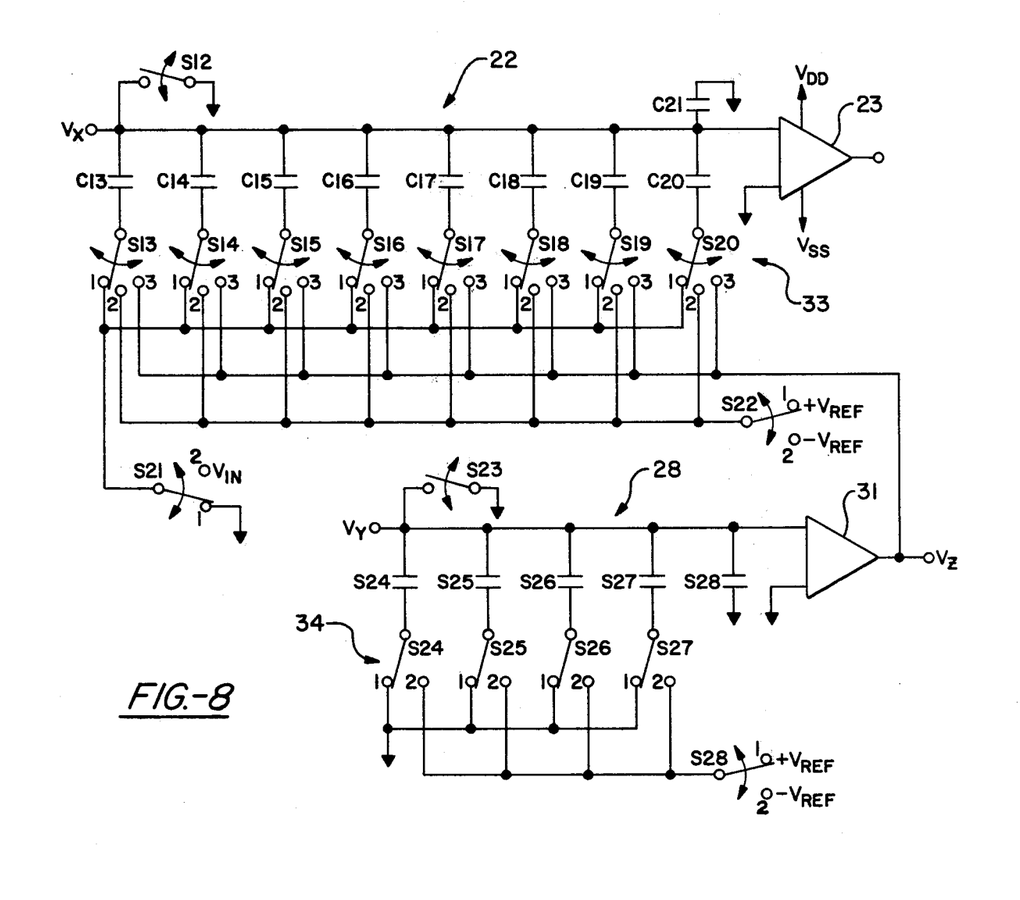
FIG. 8 is an electrical schematic diagram illustrating the arrangement of the weighted capacitor arrays and switches of the digital control and sequencing circuit of FIG. 7.

FIG. 8 shows a circuit diagram which discloses the interconnections between weighted capacitor array 22, comparator 23, buffer 31, additional weighted capacitor array 28 and certain of the switches included in the digital control and sequencing circuit 24. FIG. 8 does not include the sequencing and control logic utilized for controlling the switches seen in FIG. 8, as that control logic is well known and not part of this invention. Weighted capacitor array 22 includes capacitors C13 through C21, having capacitance values of C, C/2, C/4, C/8, C/16, C/32, C/64, C/128 and C/128 respectively. One terminal of all of the capacitors C13 through C21 is common and is connected to one input on the comparator 23. Another input on the comparator 23 is connected to the comparator reference which is ground in this example. A switch S12 is provided for connecting the common plate of the capacitors to the comparator reference voltage level, ground in this example, when closed. It then may be seen that the total of all of the capacitances C13 through C21 is 2C.

A plurality of switches 33 are included in digital control and sequencing circuit 24 and are designated as S13 through S20 in FIG. 8. Switches 33 are configured to connect the noncommon terminal on each one of the capacitors C13 through C20 to one of three terminals. The first of the three terminals selected by any of switches S13 through S20 is connected to a switch S21 having positions 1 and 2 thereon, for selecting the voltage comparator reference, ground in this example, or an analog voltage $V_{IN}$ on position 2. The second terminal on each of the switches S13 through S20 is connected to a switch S22 having positions 1 and 2 thereon for selecting a positive or negative analog reference signal level $V_{REF}$ respectively for application to ones of the noncommon terminals of capacitors C13 through C20. The third position selectable at switches S13 through S20 connects a buffered step signal $V_Z$ to individual ones of the noncommon terminals of capacitor C13 through C20. The additional weighted capacitor array 28 has included therein an array of capacitors C24 through C28 having one plate connected to a common point and to one input of unity buffer amplifier 31. Capacitors C24 through C28 are weighted in this example to assume capacitance values of C', C'/2, C'/4, C'/8 and C'/8 respectively. The common point between capacitors C24 through C28 is connected to one terminal of a switch S23 which connectes the common point to the reference voltage level for comparator 23, ground in this instance. The noncommon terminals of capacitors C24 through C27 are connected to an additional plurality of switches 34 designated S24 through S26 having positions 1 and 2 thereon for alternately selecting the reference signal level for comparator 23 on position 1 or a connection to switch S28 on position 2. Switch S28 has positions 1 and 2 for selecting either positive or negative analog reference voltage $V_{REF}$ respectively.

The two binary weighted capacitor arrays 22 and 28 are the key precision elements. Other elements as mentioned above include a binary comparator 23, a near unity gain buffer amplifier 31 with high input impedance, numerous analog switches S12 through S28 and binary sequencing and control logic totaling approximately sixty gates and flip-flops. These elements are all realizable on a single MOS chip. A conversion utilizing the circuitry of FIG. 8 proceeds as follows. Initially switches S12 through S21 and S23 through S27 are thrown to the reference voltage level for comparator 23, ground in this example. Next, switches S13 through S20 are retained in position 1 and switch S21 is thrown to position 2 to store $V_{IN}$ on the capacitor array 22. Next, S12 is opened and S21 is returned to position 1 to select ground while switches S13 through S20 are retained in the number 1 position. The sign of the successive approximation voltage $V_X$ is negative in this example which determines the sign bit of the PCM code. Thus, the analog signal $V_{IN}$ is sampled and the sample is held on the capacitor array 22. Referring to FIG. 9, the segment in the line representing the relationship between the analog and digital signals is determined by successively throwing switches S20 through S13 in inverse order starting with switch S20 from ground position 1 to analog reference voltage position 2 until the sign of successive approximation voltages $V_X$ changes. Switch S22 is thrown to position 1 to select the positive analog reference voltage if the sign of analog voltage $V_{IN}$ was previously determined to be positive and to position 2 to select the negative analog reference voltage if the sign of $V_{IN}$ was determined to be negative. If, for example, the output from comparator 23 changes after switch S18 is thrown, this indicates that the analog input voltage $V_{IN}$ lies within the segment A-B shown in FIG. 9.

The final stage in the conversion is the determination of the step within the segment. The capacitor array 28 is used in this process. Initially, as described above all switches S23 through S27 are thrown to the reference level for comparator 23, ground in this example. To follow the example entered into above, actuation of any of the switches S13 through S20 applies a trial voltage to the common point for the capacitor array 22 and the trial voltage applied by actuating switch S18 to position 2 provided the first trial voltage which caused comparator 23 to change output states at the serial digital output thereof. Consequently, switch S18 is thrown to position 3 to select a buffered subtrial voltage $V_Z$ provided at the output of unity gain buffer 31. Next S23 is opened and switches S24 through S27 are thrown in sequence from position 1, ground, to position 2 to connect the noncommon terminals of individual ones of capacitors C24 through C27 to switch S28 and to the appropriate analog voltage reference as provided at either terminal 1 or 2 on switch S28. The successive approximation algorithm is used for the "in chord" coding which determines within which of the sixteen steps of the chord A-B of FIG. 10 the analog sample signal lies. Thus, the subtrial voltage $V_Y$ is obtained at the input to unity gain buffer amplifier 31 which is provided as the buffered subtrial voltage $V_Z$ connected to terminals 3 for switches S13 through S20, and through switch S18 in this example to be combined with the trial voltage $V_X$.

The combined trial and subtrial voltage levels provide the appropriate serial digital output from comparator 23 which is connected as shown in FIG. 7 to digital control and sequencing circuit 24 for providing the corresponding digital data output therefrom.

Figure 13:
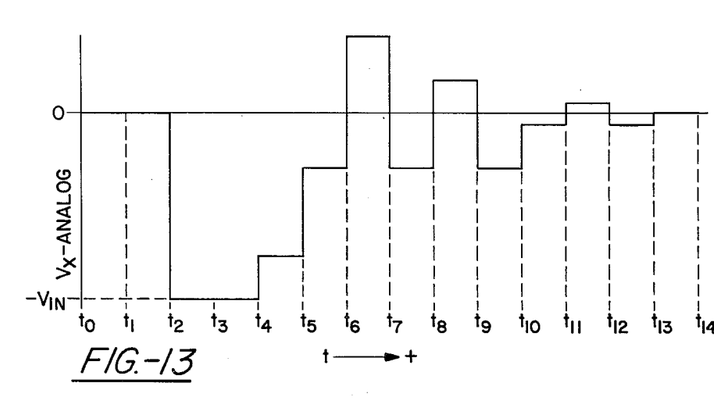
FIG. 13 is a timing diagram showing conversion of an analog signal to a digital signal utilizing the circuit of FIG. 8.
Figure 14:
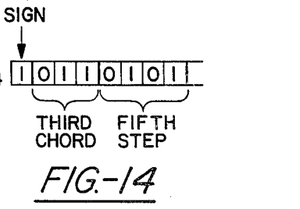
FIG. 14 is the standard pulse code modulation presentation for the companded signal associated with the timing diagram of FIG. 13.
Figure 15:
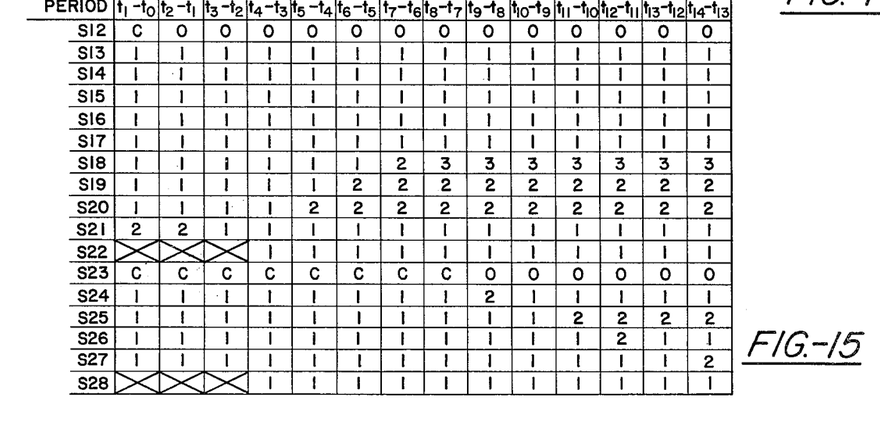
FIG. 15 is a chart showing the switch sequencing in the circuit of FIG. 8 for obtaining the successive approximation of FIG. 13.

Referring to FIG. 13 a timing diagram is shown illustrating the successive approximation described above for the circuit of FIG. 8. The successive approximation voltage $V_X$ is plotted along the ordinate of the chart of FIG. 13 and the time base is plotted along the abscissa thereof. $V_X$ is shown at the reference level for the comparator 23, zero potential or ground in this example, through the first period, $t_1$-$t_0$, when S12 is closed. S21 is set to position 2 to select the analog sample to be applied to the noncommon terminals of the capacitor array C13 through C21 simultaneously. Switch S12 is opened during the second period, $t_2$-$t_1$, and during the third period, $t_3$-$t_2$, switch S21 is returned to position 1 to select the reference for comparator 23 so that $-V_{IN}$ appears at the common terminal for the capacitor array 22. Next, S22 is placed in position 1 to select positive $V_{REF}$ at position 2 on switches S13 through S20. During the period $t_5$-$t_4$, switch S20 is thrown to position 2 to determine if the analog voltage $V_{IN}$ is within the first positive chord in the curve of FIG. 9. FIG. 13 shows that the analog voltage $V_{IN}$ is greater than that portion of the analog reference voltage applied as a trial voltage to the common point for the capacitor array 22. Switch S20 being retained in position 2, switch S19 is thrown to position 2 during the sixth period to see if a trial voltage has been obtained at the common point of the capacitor array 22 which indicates the chord has been reached wherein the analog voltage $V_{IN}$ lies. FIG. 13 shows a failure during the sixth period, $t_6$-$t_5$, and switch S18 is therefore sequenced to position 2 to present a greater predetermined portion of the analog reference voltage $V_{REF}$ to the common point of the capacitor array 22. The level of the trial voltage during the seventh period is seen to exceed the reference level for the comparator 23 and the sequencing and control circuit 24 directs switch S18 to position 3 thereby dropping the trial voltage to the level obtained by the positioning of switches S19 and S20 to position 2 and indicating that the third chord on the positive side of the curve of FIG. 9, designated A-B, contains the analog signal $V_{IN}$. During the ninth period, switch S24 is sequenced to position 2 to select a portion of the analog voltage reference to be presented at the common point of capacitor array 28 as the subtrial voltage for subsequent application to the common point of capacitor array 22 as described above. The combination of trial and subtrial voltages during period nine may be seen to be in excess of the reference voltage for comparator 23 and switch S24 is returned to position 1 during the tenth period of the conversion as seen in FIG. 13. Switch S25 is subsequently thrown to position 2 to provide a subtrial voltage as described above to the common point of capacitor array 22 which may be seen in FIG. 13 to be less than the reference voltage level for comparator 23. Consequently, switch S25 is left in the position 2 and switch 26 is thrown to position 2 during period twelve producing the signal shown in FIG. 13 in excess of the comparator reference voltage. Switch S26 is returned to position 1 and switch S27 is thrown to position 2 providing a subtrial voltage for combination with the trial voltage at the common point of capacitor array 22 which is less than the reference voltage level for comparator 23. The conversion sequence is ended for the companded analog to digital conversion and the standard PCM representation of the companded digital signal is seen in FIG. 14. The first digit represents the sign or sense of the analog to digital relation. The second, third and fourth digits represent the chord in the analog/digital relation curve as determined by the trial signal. This may be seen to be the third chord A-B in FIG. 9. The fifth through the eighth digits represent the step within the third chord through which the analog signal $V_{IN}$ passes as determined by the combination of the trial and subtrial signals. This may be seen to be the fifth step in the chord A-B as seen in FIG. 10 of the drawings. The switching sequence directed by the digital control and sequencing circuit 24 may be seen in the chart of FIG. 15. The chart shows that fourteen clock periods have been utilized for the determination of the companded digital code, but some operations may be combined so that the coding may take place in fewer clock periods than shown in the chart of FIG. 15.

Figure 11:
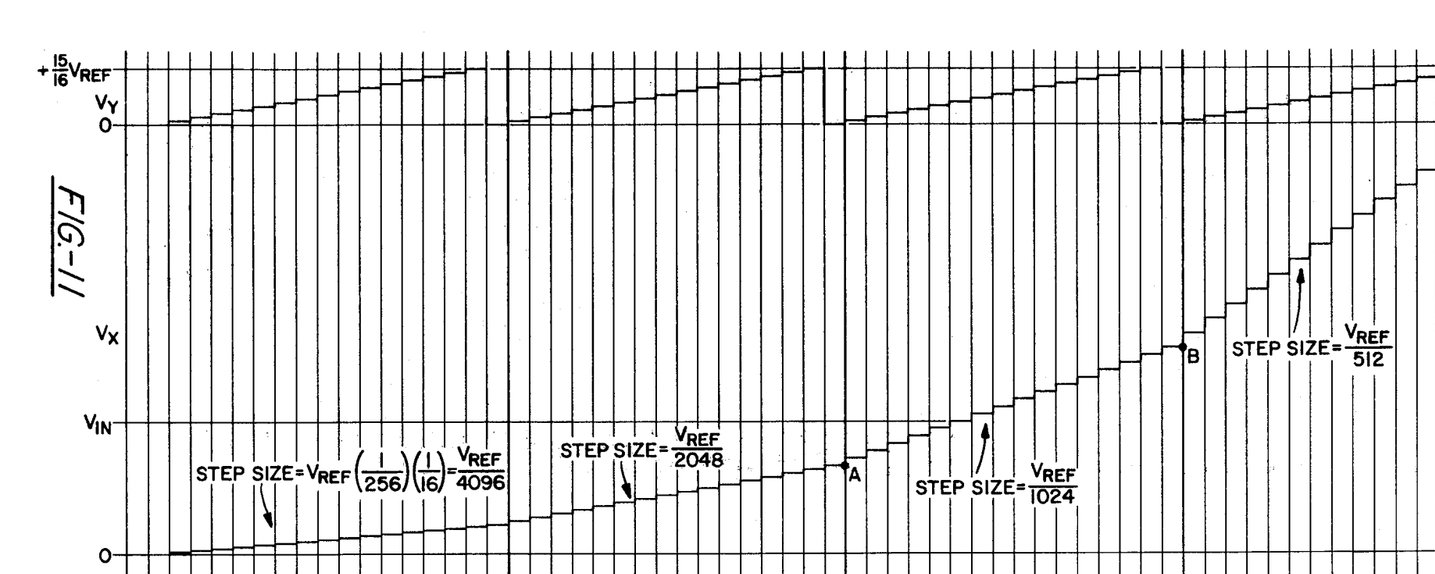
FIG. 11 is a timing diagram showing a sequence of analog signals produced by a sequence of digital signals with nonlinear relationship therebetween.
Figure 12:
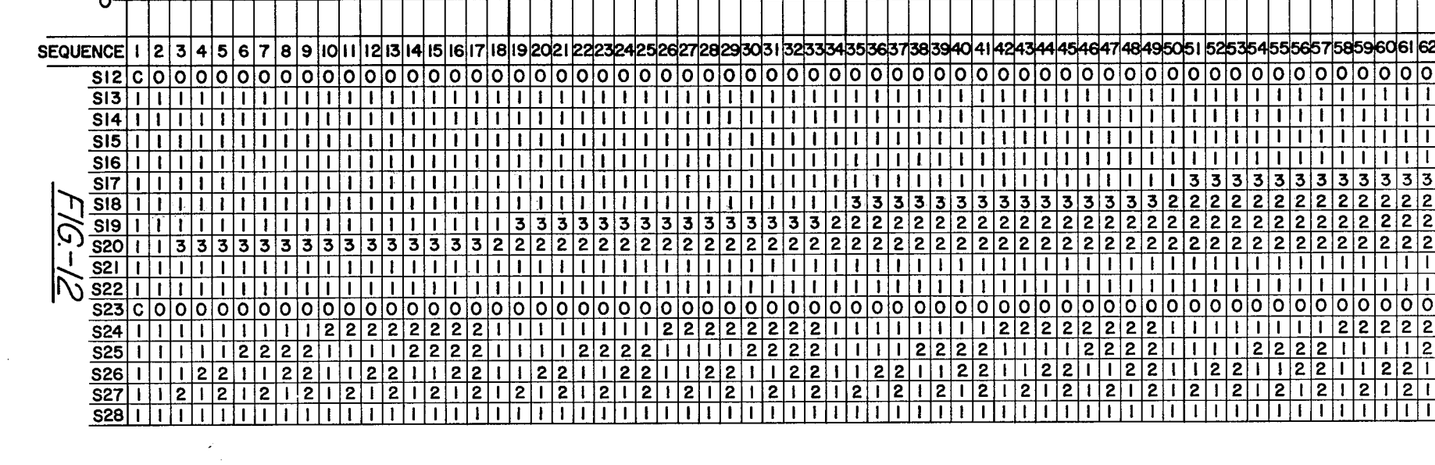
FIG. 12 is a chart showing the switching sequence for the circuit of FIG. 8 to obtain the timing diagram of FIG. 11.

The device shown in the block diagram of FIG. 7 and the electrical schematic diagram of FIG. 8 may be used as a decoder or a digital to analog converter as well. The timing diagram of FIG. 11 shows the two analog voltages $V_Y$ and $V_X$ being generated in sequence according to digital control and sequencing provided by the circuit 24 including the switches of FIG. 8 in accordance with the sequence shown in the chart of FIG. 12. FIG. 11 shows the analog voltages $V_X$ and $V_Y$ on the ordinate and the sequential time period on the abscissa. Note that the first sequence shows switches S12 and S23 closed and all other switches in the plurality of switches 33 and 34 as well as switch 21 placed in the number 1 position for selecting the reference signal level for the comparator 23, grouond in this example. Thus, all capacitors in arrays 22 and 28 are discharged initially. Next, switches S12 and S23 are opened in the second sequence. In the third sequence switch S28 is connected to the analog reference voltage on position 1, switch S27 is selected to position 2 and switch S20 is selected to position 3. In this fashion what has previously been referred to as the subtrial voltage is transferred through the voltage division provided by the additional capacitor array 28, through unity gain buffer amplifier 31, through switch S20 and the voltage division provided by capacitor array 22 to appear at the input of comparator 23 as $V_X$ seen in the third sequence of FIG. 11. The plurality of switches 34 are sequenced through the entire sixteen bit succession to provide the sixteen steps in the first chord shown in sequences two through seventeen. Corresponding switching combinations for the plurality of switches 34 are shown in the sequences two through seventeen of FIG. 12. The variation of $V_Y$ is shown for these corresponding switching combinations in FIG. 11.

Switch S20 is placed in position 2 during the eighteenth sequence and switch S19 is placed in position 3 during the ninteenth sequence. The plurality of switches 34 are sequenced through the entire sixteen bit succession as described above providing the sixteen steps in the second chord of FIG. 11. Switch S19 is returned to position 2 in the thirty-fourth sequence and switch S18 is placed in the number 3 position in the thirty-fifth sequence. The plurality of switches 34 are sequenced through the entire sixteen bit succession as before, providing the sixteen steps between the letters A—B as seen in FIG. 11. The analog voltage output decoded with the standard PCM representation of FIG. 14 is shown as $V_{IN}$ in FIG. 11 intercepting the fifth step of the third chord in the digital/analog relationship. It should be noted that FIG. 11 represents a decoded analog voltage for a successive series of digital inputs. When a specific standard PCM representation is applied to the decoder it is not necessary to generate the analog values in sequence when using the circuit as a digital to analog device. By one set of switch closures any analog output voltage may be generated for a particular PCM companded digital input.

A device for conversion between an analog and a digital indication is provided which is all MOS contruction, which contains compensation for parasitic capacitance and comparator offset errors and which may be applied on a per channel basis in nonlinear analog/digital coding and decoding. The basic converting circuit structure for conversion between analog and digital forms of signal is utilized in both the linear and nonlinear conversion structures.

What is claimed is:

1. An analog/digital converter for converting between an analog and a digital signal, comprising an array of binary weighted capacitors having capacitance values corresponding to a predetermined number of binary bits ranging from a most to a least significant bit, a common plate node within said array, a voltage comparator having first and second input terminals and an output terminal, said common plate node being connected to said first input terminal, said second input terminal being connected to a first predetermined reference, a digital control circuit coupled to said output terminal, a first switch operated by said digital control circuit to selectively connect said common plate node to said first predetermined reference, a second switch operated by said digital control to alternately select the analog signal and a second predetermined reference, and a plurality of additional switches operated by said digital control circuit, each of said plurality of additional switches being configured to selectively connect ones of said array of binary weighted capacitors to said first predetermined reference and said second switch, said digital control circuit being responsive to a serial digit input sequence so that said array of binary weighted capacitors sequentially samples and holds the analog signal, divides said second predetermined reference signal into binary weighted portions, combines the binary weighted portions with the analog signal to provide combined signal levels, and said comparator comprises each of said combined signal levels with said first predetermined reference, whereby said voltage comparator quantizes said analog signal as a serial digit output at said output terminal.

2. An analog/digital converter as in claim 1 wherein said voltage comparator has an offset voltage level characteristic, together with means for storing said offset voltage level at said common plate node at the time of sampling, whereby comparator offset is cancelled.

3. An analog/digital converter as in claim 1 wherein said voltage comparator comprises at least two stages, each of said stages having an offset voltage level characteristic, and means included in said voltage comparator for storing a compensation signal for cancelling at least one of said offset voltage levels.

4. An analog/digital converter as in claim 1 wherein said array of binary weighted capacitors, additional capacitor voltage comparator, digital control circuit, first and second switches, and plurality of additional switches are on a single semiconductor chip and are of metal oxide semiconductor construction.

5. An analog/digital converter as in claim 1 wherein the relation between the analog and digital signal is nonlinear together with a second array of binary weighted capacitors having capacitance values corresponding to a predetermined number of binary bits ranging from a most to a least significant bit, a second additional capacitor connected to said second array having a capacitance value equivalent to that of the capacitor in said second array corresponding to said least significant bit, said second additional capacitor and second array having a second array common plate node therebetween, a buffer amplifier having a pair of input terminals and an output terminal, said second array common plate connection being connected to one of said pair of input terminals, said first predetermined reference being connected to the other of said pair of input terminals, said plurality of additional switches each having an additional configuration for selectively connecting ones of said array of binary weighted capacitors to said buffer amplifier output terminal, a second plurality of additional switches operated by said digital control circuit, each of said second plurality of additional switches being configured to selectively connect ones of said second array of binary weighted capacitors to said first and second predetermined references, said plurality of additional switches operating to select a predetermined portion of the nonlinear relation and said second plurality of additional switches operating to select a predetermined step within said predetermined portion.

6. An analog/digital converter as in claim 5 wherein said voltage comparator has an offset voltage level characteristic and wherein said voltage comparator includes an output circuit together with means for detecting and storing said offset voltage level in said output circuit for substantially cancelling the effect of said offset voltage in said output circuit.

7. An analog/digital converter as in claim 5 wherein said array and second array of binary weighted capacitors, additional and second additional capacitors, voltage comparator, buffer amplifier, digital control circuit, first and second switches, and plurality and second plurality of switches are of metal oxide semiconductor construction.

8. An analog/digital converter for converting between an analog and a digital signal, and operating in conjunction with an analog signal, a first reference signal, and a second reference signal, comprising a voltage comparator having first and second input terminals and an output terminal, a digital control circuit coupled to said voltage comparator, a capacitor array coupled to said voltage comparator and said digital control circuit, said digital control circuit providing digital data and switching control signals, said capacitor array including a plurality of capacitors each having first and second terminals, each of said plurality of capacitors having a digital weighted capacitance value corresponding to individual digits in a predetermined range from a most to a least significant digit, said first capacitor terminals being common with said first input terminal, a switch selectively connecting said first input terminal with said first reference signal, said second input terminal connected to said first reference signal, a plurality of additional switches operating to connect ones of said second capacitor terminals selectively to said analog signal, said first reference signal, and said second reference signal, so that when said first switch is opened and said additional switches connect said second capacitor terminals to said analog signal change is sampled and held on said capacitor array, and thereafter distributed and redistributed among ones of said plurality of capacitors by said first switch and additional switches in accordance with said switching control signals, so that a digital combination is provided at said digital control circuit in response to the sampled analog signal.

9. An analog/digital converter as in claim 8 together with means for converting an additional digital signal to an additional analog signal, said last named means being coupled to said digital control circuit, said additional analog signal having a magnitude which is a portion of said second reference signal in accordance with said additional digital signal, means for selectively switching said additional analog signal to ones of said second terminals in accordance with said serial digital output, whereby charge is distributed in accordance with both said capacitor array and said means for converting, and said digital combination and analog signal are in nonlinear relation.

10. An analog/digital converter as in claim 8 wherein said comparator has an offset signal level together with means for storing said offset signal level and for providing a signal coupled to said comparator for substantially cancelling said offset signal level.

11. An analog/digital converter as in claim 8 wherein said voltage comparator, digital control circuit, and capacitor array are metal oxide semiconductor construction.

12. An analog/digital converter as in claim 8 together with an additional capacitor array coupled to said digital control circuit, said additional capacitor array including an additional plurality of capacitors each having a digital weighted capacitance value corresponding to digits in a predetermined range from a most to a least significant digit and each having a pair of electrical terminals, one of said pair of electrical terminals on each of said capacitors in said additional capacitor array being common, and the other of said pair of being separate, a buffer amplifier coupled between said common electrical terminals on said additional capacitor array and said capacitor array and providing a buffer output, means for selectively switching ones of said separate electrical terminals to receive said second reference signal, thereby imparting a reference charge to said additional capacitor array, means controlled by said digital control circuit for distributing said reference charge between capacitors in said additional capacitor array, and means for selectively switching said buffer output to ones of said second terminals, said last named means being controlled by said digital control circuit, whereby said digital combination and analog signal are in nonlinear relation.

13. An analog/digital converter as in claim 12 wherein said voltage comparator, digital control circuit, capacitor array and additional capacitor array are metal oxide semiconductor construction.

14. A method of converting between an analog and a digital indication comprising the steps of weighting an array of capacitors to assume capacitance values in digital relation from a most to a least significant digit, connecting one side of each capacitor in the array to a common point, discharging the array of capacitors, sampling an analog signal by charging the uncommon sides in the array of capacitors with the analog signal, holding the sampled charge on the array of capacitors by coupling the uncommon sides to a first charge reference level, connecting a second reference charge level from a reference energy source to the uncommon side of each capacitor in the array in predetermined sequence, thereby redistributing charge therebetween and producing a predetermined sequence of trial signals on the common point, coupling the common point to a comparator input, coupling another input on the comparator to the first charge reference level so that a serial digit output is provided at the output of the comparator in accordance with serial comparisons between the second reference and trial signals, said step of connecting a second reference charge level in predetermined sequence operating to cause the trial signals to converge toward the first charge reference level, whereby charge on parasitic capacitance in the converter appearing between the common point and the second reference charge level converges toward the charge level attained during the step of holding, and sequencing the steps of discharging, sampling, holding and redistributing so that the serial digital output is in a predetermined digit sequence.

15. A method as in claim 14 together with the steps of weighting an additional array of capacitors to assume capacitance values in digital relation from a most to a least significant digit, connecting one end of each capacitor in the additional array to an additional array common point, switching a reference charge from the reference energy source to predetermined combinations of the capacitors in the additional array, thereby distributing charge therebetween and producing a subtrial signal on the additional array common point, coupling the subtrial signal to one of the array of capacitors after the second reference charge level is applied thereto, so that the trial signal assumes a level indicative of a combination of the trial and subtrial signals, and sequencing the switching of the reference charge so that the serial digital output is in a predetermined digit and subdigit sequence corresponding to the trial and subtrial signals respectively, whereby the analog and digital indications are in nonlinear relation.

16. A method as in claim 14 together with the steps of converting a digital signal to an additional analog signal wherein the digital signal is determined by the serial digit output and the additional analog signal is a corresponding portion of the reference energy source output, coupling the additional analog signal to the last capacitor in the array of capacitors to which the second reference level charge was applied, so that the signal on the common point assumes a level indicative of a combination of the trial and additional analog signals, and the serial digital output is in a predetermined digit and subdigit sequence corresponding to the trial and additional analog signal respectively, whereby the analog and digital indications are in nonlinear relation.

* * * * *